US012577666B2

(12) United States Patent
Sangplug et al.

(10) Patent No.: US 12,577,666 B2
(45) Date of Patent: Mar. 17, 2026

(54) PRECURSOR DISPENSING SYSTEMS WITH LINE CHARGE VOLUME CONTAINERS FOR ATOMIC LAYER DEPOSITION

(71) Applicant: LAM RESEARCH CORPORATION, Fremont, CA (US)

(72) Inventors: Saangrut Sangplug, Sherwood, OR (US); Aaron Durbin, Portland, OR (US); Murthi Murugaiyan, Bangalore (IN); Aaron Blake Miller, West Linn, OR (US); Huatan Qiu, Portland, OR (US); Gopinath Bhimarasetti, Portland, OR (US); Vikrant Rai, Sherwood, OR (US); Vincent Wilson, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 59 days.

(21) Appl. No.: 18/037,146

(22) PCT Filed: Dec. 1, 2021

(86) PCT No.: PCT/US2021/061351

§ 371 (c)(1),
(2) Date: May 16, 2023

(87) PCT Pub. No.: WO2022/119893

PCT Pub. Date: Jun. 9, 2022

(65) Prior Publication Data

US 2024/0003008 A1      Jan. 4, 2024

(30) Foreign Application Priority Data

Dec. 3, 2020    (IN) .............................. 202041052660

(51) Int. Cl.
C23C 16/455        (2006.01)

(52) U.S. Cl.
CPC .. C23C 16/45544 (2013.01); C23C 16/45536 (2013.01); C23C 16/45561 (2013.01); C23C 16/45565 (2013.01)

(58) Field of Classification Search
CPC ....... C30B 25/08; C30B 29/403; C30B 25/14; C30B 25/165; C23C 16/303;
(Continued)

(56) References Cited

U.S. PATENT DOCUMENTS 6,039,809 A * 3/2000 Toyama .................. B01F 23/19
                                                          118/726
7,011,710 B2 * 3/2006 Bang ................. C23C 16/45565
                                                          118/724

(Continued)

FOREIGN PATENT DOCUMENTS

EP          1347077 A1      9/2003
WO      WO-9403284 A1      2/1994

OTHER PUBLICATIONS

International Search Report and Written Opinion of the ISA issued in PCT/US2021/061351, mailed Mar. 24, 2022; ISA/KR.

*Primary Examiner* — Rudy Zervigon

(57) ABSTRACT

A precursor dispensing system includes a source, an ampoule, a first valve, a second valve, a line charge volume container and a controller. The source supplies a liquid precursor. The ampoule receives the liquid precursor from the source. The first valve adjusts flow of the liquid precursor from the source to the ampoule. The second valve adjusts flow of a precursor vapor from the ampoule to a showerhead of a substrate processing chamber. The line charge volume container is connected to a conduit and stores a charge of the precursor vapor, where the conduit extends from the ampoule to the second valve. The controller: opens the first valve and closes the second valve to precharge the line charge volume container; and during a dose operation, open the second valve to dispense a bulk amount of the precursor vapor from the line charge volume container and into the substrate processing chamber.

29 Claims, 6 Drawing Sheets

(58) Field of Classification Search
CPC . C23C 16/4482; C23C 16/52; C23C 16/4408;
C23C 16/45525; C23C 16/4583; C23C
16/448; C23C 16/45544; C23C 16/455;
C23C 16/4481; C23C 16/45536; C23C
16/45561; C23C 16/45565; C23C 16/452;
G01F 23/0007; G01F 23/04; B01J 4/008;
B67D 7/3263; B67D 7/0238
USPC .............. 118/726, 727; 156/345.29, 345.37;
122/21
See application file for complete search history.

(56) References Cited

U.S. PATENT DOCUMENTS

| | | | |
|---|---|---|---|
| 7,775,236 B2 * | 8/2010 | Gold | H01L 21/67098 |
| | | | 137/487.5 |
| 2009/0061648 A1 * | 3/2009 | Horii | C23C 16/45525 |
| | | | 118/694 |
| 2009/0266296 A1 * | 10/2009 | Tachibana | C23C 16/4485 |
| | | | 118/715 |
| 2010/0022097 A1 * | 1/2010 | Yamoto | C23C 16/45544 |
| | | | 438/758 |
| 2011/0003482 A1 * | 1/2011 | Ogawa | H01L 21/31604 |
| | | | 118/694 |
| 2011/0008955 A1 * | 1/2011 | Horii | C23C 16/45561 |
| | | | 118/704 |
| 2011/0091650 A1 | 4/2011 | Naguchi et al. | |
| 2012/0040098 A1 * | 2/2012 | Toda | C23C 16/4481 |
| | | | 239/128 |
| 2014/0261733 A1 * | 9/2014 | Wu | C23C 16/45561 |
| | | | 137/15.04 |
| 2017/0167022 A1 | 6/2017 | Shin | |
| 2020/0328100 A1 * | 10/2020 | Hirose | C23C 16/45544 |
| 2021/0324513 A1 * | 10/2021 | Kimoto | C23C 16/45561 |
| 2022/0356581 A1 * | 11/2022 | Narushima | C23C 16/45561 |

* cited by examiner

PRECURSOR DISPENSING SYSTEMS WITH LINE CHARGE VOLUME CONTAINERS FOR ATOMIC LAYER DEPOSITION

CROSS-REFERENCE TO RELATED APPLICATIONS

This application is a U.S. National Phase Application under 35 U.S.C. 371 of International Application No. PCT/US2021/061351, filed on Dec. 1, 2021, which claims the benefit of Indian Application No. 202041052660, filed on Dec. 3, 2020. The entire disclosures of the above applications are incorporated herein by reference.

FIELD

The present disclosure relates to supply of precursor vapor during atomic layer deposition (ALD).

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems typically include a processing chamber enclosing a pedestal on which a substrate such as a semiconductor wafer is arranged during processing. A gas delivery system may introduce a process gas mixture including one or more precursors into the processing chamber to deposit a film on the substrate or to etch the substrate. Plasma may be struck in the processing chamber. Alternatively, plasma may be generated remotely from (i.e., outside) the processing chamber and then introduced into the processing chamber.

Some substrate processing systems use atomic layer deposition (ALD) to deposit a thin film on a substrate. For thermal ALD, each ALD cycle includes a dose step, a purge step, a reactant step and a purge step. During the dose step, a gas delivery system supplies a first precursor into the processing chamber. The first precursor adsorbs onto an exposed surface of the substrate. Then, the first precursor is purged from the processing chamber. During the reactant step, a second precursor is supplied and reacts with the first precursor to create a monolayer of the film. Then, the second precursor is purged from the processing chamber.

For plasma-enhanced ALD, each ALD cycle typically includes a dose step, a purge step, a plasma step and a purge step. During the plasma step, the plasma causes a chemical reaction to occur, which creates the monolayer of the film. Since each ALD cycle deposits a monolayer, the ALD cycles need to be repeated very quickly. In other words, the precursors and purging need to be done very quickly to deposit film of a desired thickness.

SUMMARY

A precursor dispensing system is provided and includes a first source, a first ampoule, a first valve, a second valve, a first line charge volume container and a controller. The first source is configured to supply a first liquid precursor. The first ampoule is configured to receive the first liquid precursor from the first source. The first valve is configured to adjust flow of the first liquid precursor from the first source to the first ampoule. The second valve is configured to adjust flow of a first precursor vapor from the first ampoule to a showerhead of a substrate processing chamber. The first line charge volume container is connected to a conduit and configured to store a charge of the first precursor vapor, where the conduit extends from the first ampoule to the second valve. The controller is configured to: open the first valve and close the second valve to precharge the first line charge volume container; and during a first dose operation, open the second valve to dispense a bulk amount of the first precursor vapor from the first line charge volume container and into the substrate processing chamber.

In other features, the controller is configured to precharge the first line charge volume container while performing non-dose operations.

In other features, the controller is configured to precharge the first line charge volume container while performing a dose operation including discharging a second line charge volume container.

In other features, the precursor dispensing system further includes a second source, a second ampoule, and a third valve. The second source is configured to supply a second liquid precursor. The second ampoule is configured to receive the second liquid precursor from the second source. The third valve is configured to adjust flow of the second liquid precursor from the second source to the second ampoule. The controller is configured to: open the third valve and close the second valve to precharge the first line charge volume container with a second precursor vapor from the second ampoule concurrently with the first precursor vapor; and during the first dose operation, open the second valve to dispense a bulk amount of the first precursor vapor and the second precursor vapor from the first line charge volume container and into the substrate processing chamber.

In other features, the precursor dispensing system further includes a second source, a second ampoule, a third valve, and a fourth valve. The second source is configured to supply a second liquid precursor. The second ampoule is configured to receive the second liquid precursor from the second source. The third valve is configured to adjust flow of the second liquid precursor from the second source to the second ampoule. The fourth valve is configured to adjust flow of a second precursor vapor from the second ampoule to the showerhead. The controller is configured to: open the third valve and close the fourth valve to precharge the first line charge volume container with the second precursor vapor; and during a second dose operation subsequent to the first dose operation, open the fourth valve to dispense a bulk amount of the second precursor vapor from the first line charge volume container and into the substrate processing chamber.

In other features, the precursor dispensing system further includes a second source, a second ampoule, a third valve, a fourth valve and a second line charge volume container. The second source is configured to supply a second liquid precursor. The second ampoule is configured to receive the second liquid precursor from the second source. The third valve is configured to adjust flow of the second liquid precursor from the second source to the second ampoule. The fourth valve is configured to adjust flow of a second precursor vapor from the second ampoule to the showerhead. The second line charge volume container is connected to a second conduit, wherein the second conduit extends from the second ampoule to the second valve and stores a charge of the second precursor vapor. The controller is configured to: open the third valve and close the fourth valve to precharge the second line charge volume container with the second precursor vapor; and during a second dose operation subsequent to the first dose operation, open the fourth valve to dispense a bulk amount of the second precursor vapor from the second line charge volume container and into the substrate processing chamber.

In other features, the precursor dispensing system further includes a second source, a second ampoule, a third valve, a fourth valve and a second line charge volume container. The second source is configured to supply a second liquid precursor. The second ampoule is configured to receive the second liquid precursor from the second source. The third valve is configured to adjust flow of the second liquid precursor from the second source to the second ampoule. The fourth valve is configured to adjust flow of a second precursor vapor from the second ampoule to the showerhead. The second line charge volume container is connected to a second conduit, where the second conduit extends from the second ampoule to the second valve and stores a charge of the second precursor vapor. The controller is configured to: open the third valve and close the fourth valve to precharge the second line charge volume container with the second precursor vapor; and during the first dose operation, open the fourth valve to dispense a bulk amount of the second precursor vapor from the second line charge volume container and into the substrate processing chamber.

In other features, the precursor dispensing system further includes a second source and a third valve. The second source is configured to supply a carrier gas. The third valve is configured to adjust flow of the carrier gas from the second source to the first ampoule. The controller is configured to, during the first dose operation, flow the carrier gas across the first liquid precursor in the first ampoule to entrain the first precursor vapor to flow into the showerhead.

In other features, the controller is configured to, during the first dose operation, refrain from flowing a carrier gas across the first liquid precursor.

In other features, the controller is configured to maintain the first valve at least partially open during the first dose operation.

In other features, the controller is configured to close the first valve prior to or during the first dose operation.

In other features, the precursor dispensing system further includes a third valve configured to divert a portion of the first precursor vapor from being received by the showerhead. The controller is configured to control the third valve to divert excess of the first precursor vapor away from the showerhead.

In other features, the precursor dispensing system further includes a second source and a third source. The second source is configured to supply a purge gas. The third source is configured to supply a conversion gas. The first valve includes a first input, a second input and an output. The first input receives an output from the second source. The second input receives the output of the first ampoule or the third source. The controller controls the first valve to flow the purge gas through the first valve and to the output of the first valve to prevent back streaming of non-purge gas to the first source or the third source.

In other features, the precursor dispensing system further includes a valve assembly, a second source, and a third source. The valve assembly includes the first valve, a first input, a second input and an output. The second source is configured to supply a purge gas to the first input. The third source is configured to supply a conversion gas. The second input receives the output of the first ampoule or the third source. The controller controls the valve assembly to flow the purge gas through the valve assembly and to the output of the valve assembly to prevent back streaming of non-purge gas to the first source or the third source.

In other features, an atomic layer deposition system is provided and includes the precursor dispensing system, a third valve, a second source and a generator. The third valve is configured to adjust flow of a conversion gas to the substrate processing chamber. The second source is configured to supply the conversion gas. The generator is configured to generate a radio frequency signal. The controller is configured to, subsequent the dose operation: decrease flow of the first precursor vapor to the showerhead; purge the substrate processing chamber; supply the conversion gas to the substrate processing chamber; and control operation of the generator to supply the radio frequency signal to the showerhead.

In other features, the controller is configured to precharge the first line charge volume container while supplying the conversion gas to the substrate processing chamber.

In other features, a precursor dispensing method is provided and includes: receiving a first liquid precursor from a first source at a first ampoule; providing a first valve to adjust flow of the first liquid precursor from the first source to the first ampoule; providing a second valve to adjust flow of a first precursor vapor from the first ampoule to a showerhead of a substrate processing chamber; opening the first valve and closing the second valve to precharge a first line charge volume container, where the first line charge volume container is connected to a conduit and configured to store a charge of the first precursor vapor, and where the conduit extends from the first ampoule to the second valve; and during a first dose operation, opening the second valve to dispense a bulk amount of the first precursor vapor from the first line charge volume container and into the substrate processing chamber.

In other features, the precursor dispensing method further includes precharging the first line charge volume container while performing non-dose operations.

In other features, the precursor dispensing method further includes precharging the first line charge volume container while performing a dose operation for a second line charge volume container.

In other features, the precursor dispensing method further includes: receiving a second liquid precursor from a second source at a second ampoule; providing a third valve configured to adjust flow of the second liquid precursor from the second source to the second ampoule; opening the third valve and closing the second valve to precharge the first line charge volume container with a second precursor vapor from the second ampoule concurrently with the first precursor vapor; and during the first dose operation, opening the second valve to dispense a bulk amount of the first precursor vapor and the second precursor vapor from the first line charge volume container and into the substrate processing chamber.

In other features, the precursor dispensing method further includes: receiving at a second ampoule a second liquid precursor from a second source; providing a third valve configured to adjust flow of the second liquid precursor from the second source to the second ampoule; providing a fourth valve configured to adjust flow of a second precursor vapor from the second ampoule to the showerhead; opening the third valve and closing the fourth valve to precharge the first line charge volume container with the second precursor vapor; and during a second dose operation subsequent to the first dose operation, opening the fourth valve to dispense a bulk amount of the second precursor vapor from the first line charge volume container and into the substrate processing chamber.

In other features, the precursor dispensing method further includes: receiving at a second ampoule a second liquid precursor from a second source; providing a third valve configured to adjust flow of the second liquid precursor from the second source to the second ampoule; providing a fourth valve configured to adjust flow of a second precursor vapor from the second ampoule to the showerhead; opening the third valve and closing the fourth valve to precharge a second line charge volume container with the second precursor vapor, where the second line charge volume container connected to a second conduit, and where the second conduit extends from the second ampoule to the second valve and stores a charge of the second precursor vapor; and during a second dose operation subsequent to the first dose operation, opening the fourth valve to dispense a bulk amount of the second precursor vapor from the second line charge volume container and into the substrate processing chamber.

In other features, the precursor dispensing method further includes: receiving at a second ampoule a second liquid precursor from a second source; providing a third valve configured to adjust flow of the second liquid precursor from the second source to the second ampoule; providing a fourth valve configured to adjust flow of a second precursor vapor from the second ampoule to the showerhead; and opening the third valve and closing the fourth valve to precharge a second line charge volume container with the second precursor vapor, where the second line charge volume container connected to a second conduit, and where the second conduit extends from the second ampoule to the second valve and stores a charge of the second precursor vapor. During the first dose operation, open the fourth valve to dispense a bulk amount of the second precursor vapor from the second line charge volume container and into the substrate processing chamber.

In other features, the precursor dispensing method further includes: providing a third valve configured to adjust flow of a carrier gas received from a second source to the first ampoule; and during the first dose operation, flowing the carrier gas across the first liquid precursor in the first ampoule to entrain the first precursor vapor to flow into the showerhead.

In other features, the precursor dispensing method further includes, during the first dose operation, refraining from flowing a carrier gas across the first liquid precursor.

In other features, the precursor dispensing method further includes maintaining the first valve at least partially open during the first dose operation.

In other features, the precursor dispensing method further includes closing the first valve prior to or during the first dosing operation.

In other features, the precursor dispensing method further includes: providing a third valve configured to divert a portion of the first precursor vapor from being received by the showerhead; and controlling the third valve to divert excess of the first precursor vapor away from the showerhead.

In other features, the precursor dispensing method further includes: supplying a purge gas via a second source; supplying a conversion gas via a third source; receiving an output from the second source at the first valve; receiving an output of the first ampoule or the third source at the first valve; and controlling the first valve to flow the purge gas through the first valve and to an output of the first valve to prevent back streaming of non-purge gas to the first source or the third source.

In other features, the precursor dispensing method further includes: providing a valve assembly comprising the first valve; supplying a purge gas via a second source; supplying a conversion gas via a third source; receiving at the valve assembly an output of the first ampoule or the third source; and controlling the valve assembly to flow the purge gas through the valve assembly and to an output of the valve assembly to prevent back streaming of non-purge gas to the first source or the third source.

In other features, an atomic layer deposition method is provided and includes the precursor dispensing method and: providing a third valve configured to adjust flow of a conversion gas to the substrate processing chamber; generating a radio frequency signal; and subsequent the dose operation, decreasing flow of the first precursor vapor to the showerhead, purging the substrate processing chamber, supplying the conversion gas from a second source to the substrate processing chamber, and supplying the radio frequency signal to the showerhead.

In other features, the atomic layer deposition method further includes precharging the first line charge volume container while supplying the conversion gas to the substrate processing chamber.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
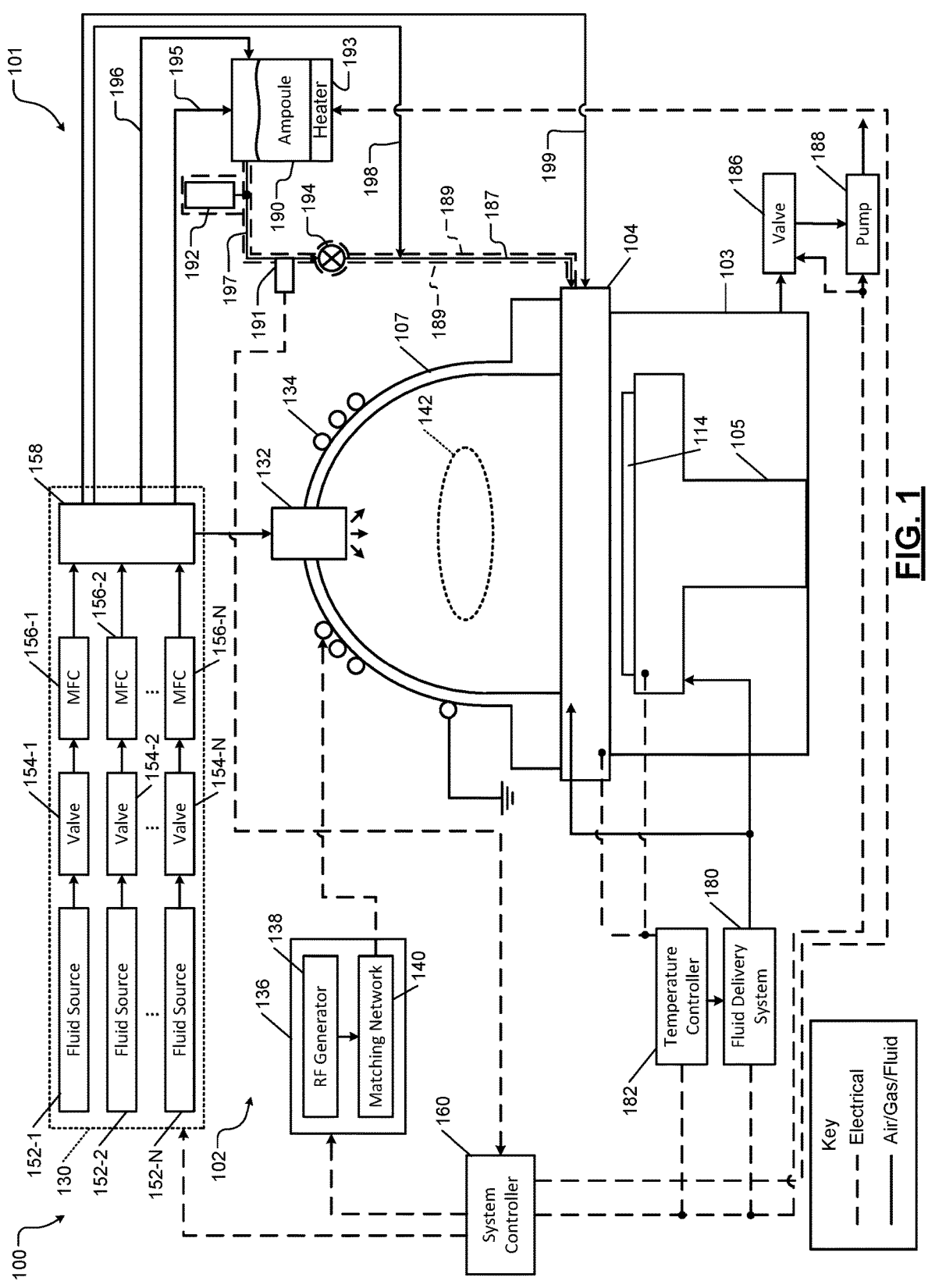
FIG. 1 is a functional diagram of an example of a substrate processing system incorporating a precursor dispensing system in accordance with an embodiment of the present disclosure.

While the examples set forth below relate to ALD with remote plasma that is generated using inductively coupled plasma (ICP), the present disclosure relates to the delivery of precursor and other gas mixtures in other types of substrate processing systems. For example, the present disclosure also relates to ALD processes performing thermal ALD (with no plasma), ALD with remote plasma from other types of remote plasma sources, ALD with direct plasma, etc. The remote plasma source may exist above a processing chamber and be provided through a showerhead or may be located elsewhere and fed to the showerhead. As an example, direct plasma may be generated using capacitively coupled plasma (CCP).

One or more precursor gases may be supplied to the ALD process using a flow over vapor (FOV) system. A FOV system includes an ampoule storing a liquid precursor. The temperature of the ampoule may be controlled by a heater to vaporize the liquid precursor. The liquid precursor transitions from a liquid to a vapor (or gas) based on the temperature and pressure in the ampoule. In some examples, a carrier gas flows through the ampoule and entrains the precursor vapor for delivery to the processing chamber.

Substrate processing tools may include more than one processing chamber or station. For each processing chamber, one or more liquid precursors, carrier gas and purge gas may be supplied. The liquid precursors, carrier gas and purge gas have corresponding gas supply circuits including conduits, mass flow controllers, valves, splitters and/or manifolds. One or more of the purge gas supply circuits may feed into the other gas supply circuits to prevent back streaming. The one or more purge gas supply circuits may operate in a "trickle" mode or a "purge" mode. The trickle mode includes supplying a low positive pressure of a purge (or inert) gas. The low positive pressure of purge gas may be passed through valves of the other gas supply circuits to prevent back streaming of non-inert gases and/or species from the processing chamber back into the other gas supply circuits. The purge mode includes supplying a high positive pressure of purge gas to purge the processing chamber.

The purge supply circuits that are operating in the trickle mode can be a source of dilution during a precursor dose operation. As an example, while a precursor gas is supplied, a trickle-flow of purge gas may also be supplied, which can dilute the precursor gas. The more gas supply circuits operating in a trickle purge mode, the more dilution of the precursor gas. Another source of dilution can be the supply of carrier gas that is used to entrain the precursor gas. As a result of the dilution of the precursor gas, a small percentage (e.g., 7%) of the total amount of gas supplied during the dose operation may be the precursor gas. Depending on the size (e.g., inner diameters) of supply circuit plumbing for the precursor, a limited amount, by volume and/or weight, of the precursor is able to be supplied during a set amount of time allocated for the corresponding dose operation.

The examples set forth herein include precursor dispensing systems with line charge volume (LCV) containers for ALD. LCV containers are precharged with a bulk amount of precursor and discharged during dose operations. Precharging of a LCV container refers to the prefilling and pressurizing of the LCV container prior to dispensing of the corresponding precursor that is in the LCV container. Each LCV container may be charged during (i) the RF plasma and purge (non-dose) operations, and (ii) a dose operation for another processing chamber, which does not include the gas supply circuit of that LCV.

One or more LCV containers may be provided for each station of a processing chamber. A LCV container may be shared by different precursor supply circuits of a station or a LCV container may be included for each precursor supply circuit, where each precursor supply circuit supplies a different precursor. When multiple LCV containers are used respectively for multiple precursors, one LCV container may be precharging while another LCV container is discharging. The LCV containers reduce dilution of precursor and allow the amount of precursor relative to a total amount of gas supplied to a processing chamber to be 0-100% concentration by volume. The stated concentration level depends on the flow rate and pressure of inert gas in other gas supply circuits to prevent back streaming and the flow rate and pressure of carrier gas.

Figure 2:
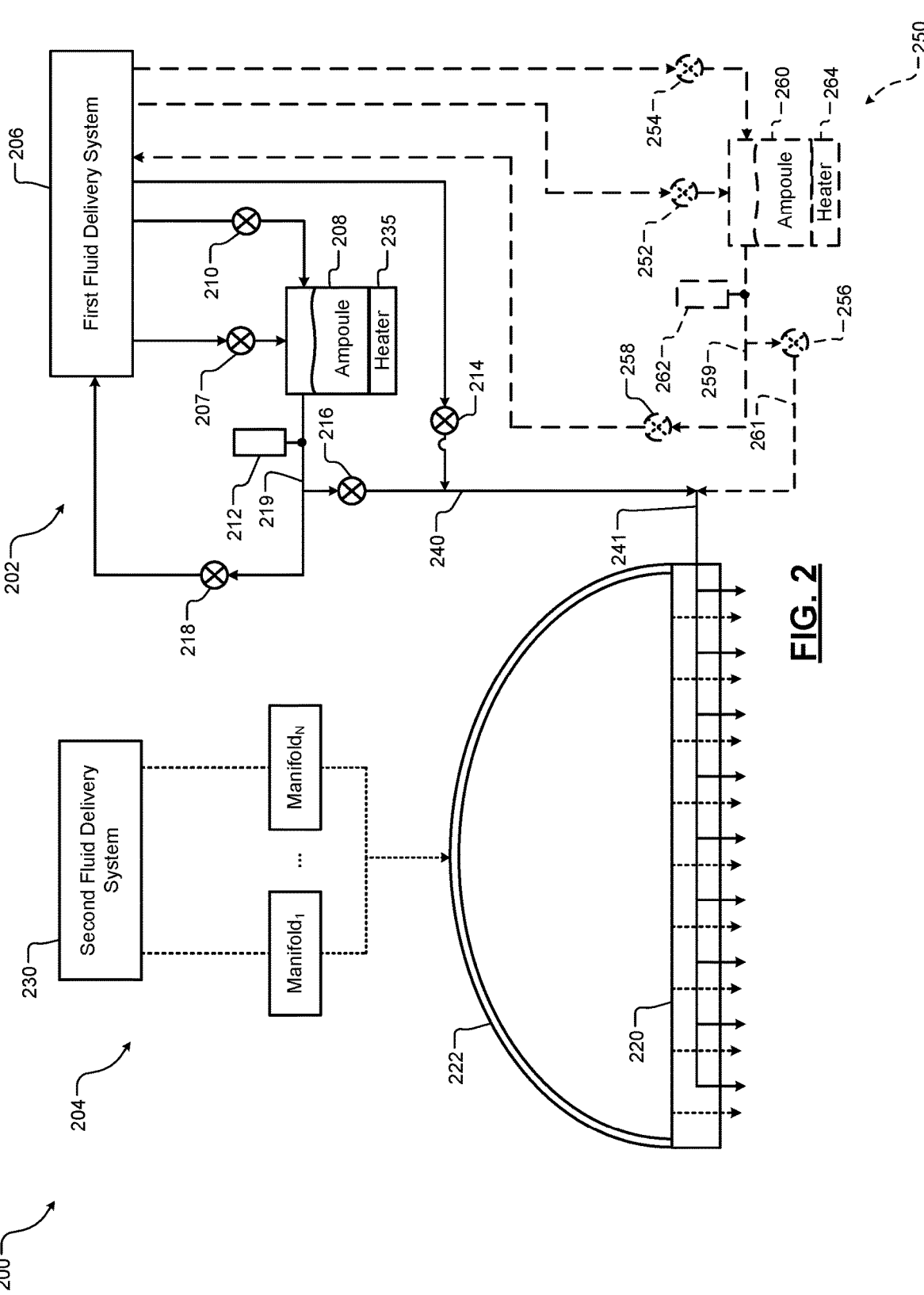
FIG. 2 is a functional diagram of an example of a fluid dispensing system for a single processing station in accordance with the present disclosure.
Figure 3:
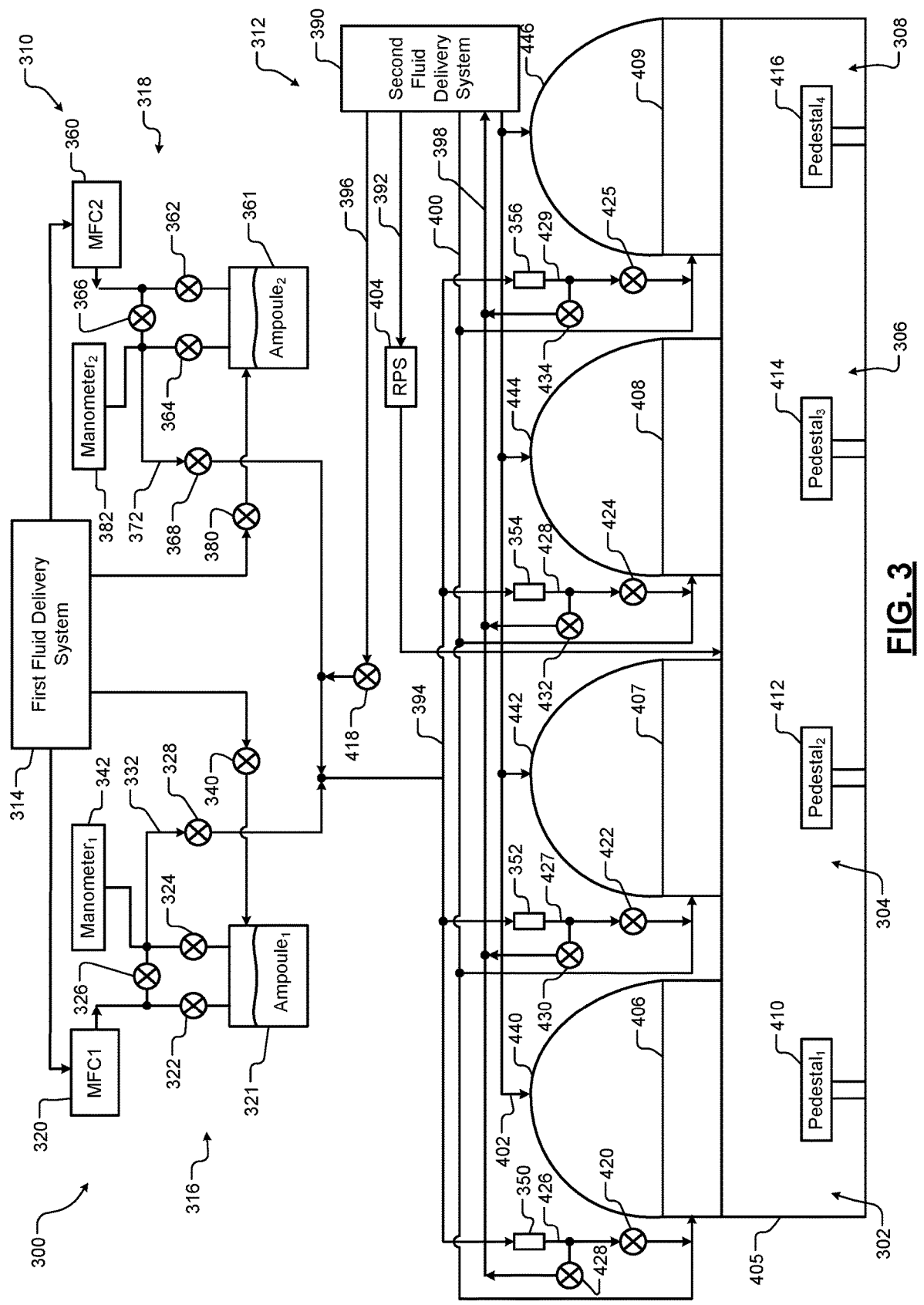
FIG. 3 is a functional diagram of an example of a fluid dispensing system for multiple processing stations in accordance with the present disclosure.

Traditional dispensing systems simply flow precursor gas without precharging to a showerhead during a dose operation. By precharging a LCV container and then bulk dispensing precursor gas from the LCV container to a showerhead during a dose operation, the disclosed examples dispense an increased amount of precursor in a shorter period of time as compared to the traditional dispensing systems. This is especially true, if certain parameters are equal, such as a partial pressure of received liquid precursor, a partial pressure of carrier gas, temperatures of ampoules, sizes of corresponding plumbing, etc. The precursor dispensing systems disclosed herein are applicable to any type of precursor vapor generating system including vapor draw systems, FOV systems and liquid vaporization systems, examples of which are shown in FIGS. 1-3 and described herein.

FIG. 1 shows a substrate processing system 100 incorporating a precursor dispensing system 101. The precursor dispensing system 101 may be configured as shown in FIG. 1, or alternatively as shown in FIGS. 2-3. The precursor dispensing system 101 may be configured similarly as any of the precursor dispensing systems disclosed herein and implement bulk precursor dispensing during dose operations as described herein.

The substrate processing system 100 includes a plasma source 102, a processing chamber 103 and one or more processing stations, each of which including a showerhead 104 and a pedestal 105 (e.g., an electrostatic chuck). The one or more stations are disposed in the processing chamber 103. An example including multiple processing stations is shown in FIG. 3. The showerhead 104 may be made of a metal (e.g., aluminum) or an alloy.

The plasma source 102 includes a dome 107 that is arranged above the showerhead 104. The showerhead 104 is arranged between the dome 107 and the processing chamber 103. The showerhead 104 separates the dome 107 from the processing chamber 103. The pedestal 105 is arranged in the processing chamber 103 directly below the showerhead 104. A substrate 114 is arranged on and held by the pedestal 105 during processing.

The dome 107 may be dome-shaped as shown or may be of any other shape. For example, the dome 107 may be replaced with an upper chamber structure having a rectangularly-shaped or a semi-hemi-spherical shaped cross section. A bottom end of the dome 107 is open and is attached to a top side of the showerhead 104 near the periphery of the showerhead 104.

For example only, the plasma source 102 generates a remote plasma (i.e., plasma outside the processing chamber 103) using ICP. The dome 107 receives one or more gases received from a fluid delivery system 130 via a gas injector 132 arranged at the top of the dome 107, although gases may be injected into the dome 107 in other ways. For example, the gases may be injected into the dome 107 through wall areas of the dome below the top and via ports in the wall areas. Although the remote plasma source 102 is shown in FIG. 1 as generally being disposed above the showerhead 104, the remote plasma source may be replaced by another plasma source located remotely away from the processing chamber 103 and feed the showerhead 104. Also, although the precursor gases are shown as being supplied to a side of the showerhead 104, the precursor gases may be provided to a center of the showerhead 104 or elsewhere. The plasma may be introduced into the processing chamber 103 via the showerhead 104 or in some other manner.

A coil 134 is arranged around the dome 107. A first end of the coil 134 is grounded, and a second end of the coil 134 is connected to a RF generating system 136. The RF generating system 136 generates and outputs RF power to the coil 134. For example only, the RF generating system 136 may include an RF generator 138 that generates the RF power. The RF generator 138 may be a high-power RF generator producing, for example, 6-10 kilo-watts (kW) of power or more. The RF generator 138 may generate respective RF signals having frequency components at respective RF frequencies. The RF power is fed by a matching network 140 to the coil 134. The plasma source 102 includes the dome 107, the coil 134, the generator 138, and the match network 140. The match network 140 matches impedance of the output of the RF generator 138 to impedance of the coil 134 as seen by the matching network 140. The RF power is supplied to the coil 134 and ignites the gas or gases injected by the gas injector 132 into the dome 107 and generates a plasma 142. Since the plasma source 102 generates the plasma 142 remotely from (i.e., outside) the processing chamber 103, the plasma 142 is referred to as a remote plasma.

The fluid delivery system 130 may be controlled by the system controller 160 and includes one or more fluid sources 152-1, 152-2, . . . , and 152-N (collectively fluid sources 152), where N is an integer greater than zero. The one or more of the fluid sources 152 supply one or more liquid precursors, gases and/or gas mixtures. The supplied liquid precursor and/or precursor gas (or vapor) may include dichlorosilane (DCS), hexachlorodisilane (HCDS), and/or other precursors. The fluid sources 152 may also supply etch gas, silicon gas (e.g., silane ($SiH_4$) or other silicon gas), carrier gas (e.g., nitrogen ($N_2$), argon (Ar) or other carrier gas), conversion gas (e.g., $N_2$, $N_2$ and hydrogen ($H_2$), oxygen ($O_2$) or other conversion gas), and/or purge gas (e.g., $N_2$, Ar or other inert and/or purge gas).

The fluid sources 152 are connected by valves 154-1, 154-2, . . . , and 154-N (collectively valves 154) and mass flow controllers (MFCs) 156-1, 156-2, . . . , and 156-N (collectively mass flow controllers 156) to a circuit 158. The fluid sources 152, valves 154 and MFCs 156 may supply fluids in parallel to the circuit 158, as shown, or may be connected in other arrangements. The other arrangements may include serial and parallel arrangements, where two or more fluids are mixed prior to being received at one or more of the valves 154, MFCs 156 and/or circuit 158. The circuit 158 may include one or more manifolds, splitters, valves, etc. An output of the circuit 158 is fed to the processing chamber 103. For example only, the output of the circuit 158 is fed to the showerhead 104. Other example fluid supply circuits are shown in FIGS. 2-3.

The showerhead 104 includes holes and/or passages for passage of gases (e.g., process, purge, and conversion gases), plasma, and/or precursor vapor. The showerhead 104 introduces and distributes the gases, plasma and/or precursor vapor into the processing chamber 103. The gases may be supplied to a top, center and/or side of the showerhead. The showerhead 104 may receive one or more precursor gases from the precursor dispensing system 101. The showerhead 104 may further include a cooling channel through which a coolant flows. A fluid delivery system 180 supplies the coolant to the cooling channel.

One or more temperature sensors (not shown) may be disposed in the showerhead 104. The temperature sensors may be connected to a temperature controller 182. The temperature controller 182 and the system controller 160 may be implemented as a single controller. The temperature controller 182 may control the supply of the coolant from the fluid delivery system 180 to the cooling channel to control the temperature of the showerhead 104.

Further, while not shown, the pedestal 105 may include one or more heaters, a cooling system that receives a coolant from the fluid delivery system 180, and one or more temperature sensors. The temperature controller 182 may be connected to the temperature sensors in the pedestal 105. The temperature controller 182 may control power supply to the heaters. The temperature controller 182 may control the supply of the coolant from the fluid delivery system 180 to the cooling system in the pedestal 105 to control the temperature of the pedestal 105.

A valve 186 and pump 188 may control pressure in the processing chamber 103 and to evacuate reactants from the processing chamber 103 during processing. A system controller 160 may control the components of the substrate processing system 100 including controlling supplied RF power levels, pressures and flow rates of supplied gases, RF matching, etc. The system controller 160 controls states of the valve 186 and the pump 188.

The valves, gas and/or coolant pumps, power sources, RF generators, etc. may be referred to as actuators. The gas channels, coolant channels, etc. may be referred to as temperature adjusting elements.

The precursor dispensing system 101 may include an ampoule (or reservoir) 190, a LCV container 192 with a heater 193, and a precursor dump valve 194. The precursor dispensing system 101 is provided as an example, other precursor dispensing systems are described below. The ampoule 190 receives liquid precursor from the fluid deliver system 130 and/or circuit 158 via a conduit 195. The heater 193 may heat the ampoule to a target temperature to aid in vaporization of the liquid precursor. In one embodiment, the heater 193 is not included. The ampoule 190 may receive a carrier gas via another conduit 196. The carrier gas flows over the liquid precursor in the ampoule 190 to deliver precursor vapor in the ampoule 190 and in the LCV container 192 to the precursor dump valve 194 via a conduit 197.

The LCV container 192, valve 194, the conduit 187 and a conduit 197, which is connected between the valve 194 and the showerhead 104, may be wrapped with a heating element, enclosed in a heated encasement and/or be heated. This is represented by dashed lines 189 and implemented to heat the LCV container 192, valve 194 and the conduits 187, 197 to a target temperature to maintain the precursor in a vapor state. The LCV container 192 and the conduit 197 are precharged prior to a dose operation. During a dose operation, the valve 194 is opened to supply precursor vapor to the showerhead 104. The showerhead 104 may receive purge gas, conversion gas and/or other process gas from the circuit 158 via conduit 198. The processing chamber 103 may receive process gas from the circuit 158 via conduit 199.

Although a single precursor dispensing circuit is shown, additional precursor dispensing circuits and/or other types of precursor dispensing circuits may be included, as shown in FIGS. 2-3 and described below. The LCV container 192 and other LCV containers disclosed herein may be of various sizes and shapes (e.g., circular, rectangular, cylindrical, etc.). The sizes of the LCV containers may be set based on charge cycle times, volumes of precursor gas needed for corresponding dose operations, recipe timing, peak vapor pressure prior to dose, allotted period of times for charging, etc. The sizes of the LCV containers are set to be at least a minimum size to prevent too high of a pressure buildup. The sizes of the LCV containers are also set to exceed a certain size, which would prevent a minimum amount of pressure buildup and to minimize associated space needed for the LCV containers.

Each LCV container (i) increases a precharge volume as compared to an internal volume of a corresponding conduit (e.g., the conduit 197) alone, and (ii) may have a larger internal volume than the internal volume of the conduit. If the LCV containers are too large, then the containers can be underutilized. The LCV containers may be sized such that internal volumes of the LCV containers are within set minimum and maximum volume ranges. The ranges may be set based on charge cycle times, volumes of precursor gas needed for corresponding dose operations, recipe timing, peak vapor pressure prior to dose, allotted period of times for charging, etc. As an example, a LCV container may have an internal volume between 50 cubic centimeters (cc) and 5 liters (L)). As another example, a LCV container may have an internal volume between 100 cc and 1 L. In another embodiment, the LCV container has an internal volume of 100 cc.

The system controller 160 may control the pressure in the LCV container 192. This may be time-based control, pressure-based control, or integral time and pressure based control. As an example, a pressure sensor 191 may be included to detect pressure in the conduit 197 and/or in the LCV container 192. The system controller 160 may continue to charge the LCV container 192 until the pressure is up to a target pressure and/or maintain supply of precursor gas to the LCV container 192 for a predetermined period of time allowing for the target pressure to be reached. LCV charging may be provided as part of a continuous mode, a start-and-stop mode, and/or an on-demand charging mode. The continuous mode refers to charging continuously for a set period of time, while certain other operations are being performed, and/or until a set pressure is reached. As an example, continuous charging may be performed while non-dosing operations are performed. A start-and-stop mode may refer to periodically starting and stopping charging for predetermined periods of time, at selective start and stop times, and/or based on certain conditions. An on-demand mode may refer to charging when requested and/or when one or more certain conditions are satisfied, for example, when pressure drops below a predetermined pressure, when a dose operation is completed, etc.

FIG. 2 shows a fluid dispensing system 200 for a single processing station. The fluid dispensing system 200 may include a first fluid dispensing system 202 and a second fluid dispensing system 204. The first fluid dispensing system 202 may include a first fluid delivery system 206, a valve 207, an ampoule (or reservoir) 208, a valve 210, a LCV container 212, a valve 214, a valve 216 and a divert valve 218. The valves 207, 210, 214, 216, 218 may be controlled by a controller, such as the system controller 160 of FIG. 1. The valve 207 controls flow of liquid precursor from the first fluid delivery system 206 to the ampoule 208. The valve 210 controls flow of carrier gas from the first fluid delivery system 206 to the ampoule 208. The LCV container 212 is precharged when the valve 207 is open and the valve 216 is closed. When the valve 216 is opened, the buildup of precursor vapor in the LCV container 212 is dumped to a showerhead 220 of a chamber 222 of the processing station. The valve 214 may control flow of purge gas from the first fluid delivery system 206 to the showerhead 220 or may be provided via valves 216, as described below with respect to FIG. 6. The divert valve 218 may be included and used to divert precursor gas from the LCV container 212 back to the first fluid delivery system 206. This may be performed when there is excess precursor in conduit (or splitter) 219, the ampoule 208 and/or the LCV container 212.

The second fluid dispensing system 204 may include a second fluid delivery system 230, manifolds$_{1-N}$, where N is an integer greater than or equal to 2. The manifolds$_{1-N}$ receive process gas from the second fluid delivery system 230, which is supplied to the showerhead 220. The fluid delivery systems 206, 230 may each be controlled by the controller and may each include fluid sources, mass flow controllers, valves, splitters, conduits, manifolds, etc.

In an embodiment, the first fluid dispensing system 202 includes a heater 235 for heating and setting temperature in the ampoule 208. The system controller 160 of FIG. 1 may control the temperature within the ampoule. Similar heaters may be provided for other ampoules disclosed herein. Although not shown in FIG. 2, the LCV container 212, the valve 216 and the conduits 219, 240, 241 may be wrapped with a heating element, enclosed in a heated encasement and/or heated to a target temperature.

In an embodiment, one or more additional fluid dispensing systems and/or circuits are included to dispense one or more additional precursor vapors into the processing chamber via the showerhead 220. The additional fluid dispensing systems and/or circuits may include a portion of the first fluid dispensing system 202 or may be distinct dispensing systems configured similarly as the first dispensing system and connected to conduit 240 extending between the valve 216 and the showerhead 220.

For example, another fluid dispensing system and/or circuit may be provided and include a fluid delivery system, valves, a LCV container, an ampoule and conduits and be configured the same as the first fluid dispensing system 202. As another example, the first fluid delivery system 206 may be shared by the first fluid dispensing system 202 and another fluid dispensing system and/or circuit. As an example, a third fluid dispensing system 250 for dispensing another precursor is shown and shares a portion of the first fluid delivery system 206. In this manner, multiple precursor vapors may be supplied to the showerhead 220 concurrently or sequentially, as further described below.

The third fluid dispensing system 250 may include valves 252, 254, 256, 258, ampoule 260, and LCV container 262 that are connected similarly as the valves 207, 210, 216, 218, ampoule 208 and LCV container 212. The third fluid dispensing system 250 may include a heater for the ampoule 260. Although not shown in FIG. 2, the LCV container 262, the valve 256 and the conduits 259, 261 may be wrapped with a heating element, enclosed in a heated encasement and/or heated to a target temperature.

FIG. 3 shows a fluid dispensing system 300 for multiple processing stations 302, 304, 306, 308. Although a certain number of processing stations are shown, any number of processing stations may be included. Each of the processing stations may be configured and/or operate similarly and/or different than the processing stations of FIGS. 1-2. The fluid dispensing system 300 may include a first fluid dispensing system 310 and a second fluid dispensing system 312, which may be controlled by the system controller 160 of FIG. 1. The first fluid dispensing system 310 may include a first fluid delivery system 314, a first precursor circuit 316, and a second precursor circuit 318. The first fluid delivery system 314 may include fluid sources, MFCs, valves, manifolds, splitters, conduits, etc.

The first precursor circuit 316 includes a first MFC 320, an ampoule 321, an ampoule input valve 322, an ampoule output valve 324, an ampoule bypass valve 326, and a first output valve 328. The MFC 320 and the valve 322 are used to control flow of carrier gas to the ampoule 321. The valve 324 may be used to control of precursor vapor from the ampoule 321 to the valve 328. The valve 326 may be used to control flow of carrier gas directly from the MFC 320 to the valve 328. The valve 328 may be used to control flow of carrier gas and/or precursor gas to LCV containers 350, 352, 354, 356 of the processing stations 302, 304, 306, 308.

The first precursor circuit 316 may further include a valve 340 for control of liquid precursor to the ampoule 321. Although not shown in FIG. 3, a MFC may be included to control flow of the liquid precursor from the first fluid delivery system 314 to the valve 340 and/or the ampoule 321.

The first precursor circuit 316 may include a manometer 342, which may be used to measure pressure in the conduit 332 between the valves 326 and 328. The system controller 160 of FIG. 1 may control operation of the MFC 320 and the valves 322, 324, 326, 328, 340 may be controlled based on the pressure indicated by the manometer 342.

The second precursor circuit 318 includes a second MFC 360, an ampoule 361, an ampoule input valve 362, an ampoule output valve 364, an ampoule bypass valve 366, and a second output valve 368. The MFC 360 and the valve 362 are used to control flow of carrier gas to the ampoule 361. The valve 364 may be used to control flow of precursor vapor from the ampoule 361 to the valve 368. The valve 366 may be used to control flow of carrier gas directly from the MFC 360 to the valve 368. The valve 368 may be used to control flow of carrier gas and/or precursor vapor to LCV containers 350, 352, 354, 356 of the processing stations 302, 304, 306, 308.

The first precursor circuit 316 may further include a valve 380 for control of a second liquid precursor to the ampoule 361. Although not shown in FIG. 3, a MFC may be included to control flow of the second liquid precursor from the first fluid delivery system 314 to the valve 380 and/or the ampoule 361. The first liquid precursor may be used to provide a first (or undercoat) layer and the second liquid precursor may be used to provide a second (or resultant deposition) layer.

The second precursor circuit 318 may include a manometer 382, which may be used to measure pressure in the conduit 372 between the valves 366 and 368. The system controller 160 of FIG. 1 may control operation of the MFC 360 and the valves 362, 364, 366, 368, 380 may be controlled based on the pressure indicated by the manometer 382.

The second fluid dispensing system 312 is connected to the first fluid dispensing system 310 and includes a second fluid delivery system 390, a remote plasma line 392, a precursor splitter 394, a silicon gas source line 396, a precursor divert manifold 398, a purge gas splitter 400 and a conversion gas splitter 402. The second fluid delivery system 390 may include fluid sources, MFCs, valves, manifolds, splitters, conduits, etc. The remote plasma line 392 includes a remote plasma source (RPS) 404 and a remote plasma clean (RPC) line receiving RPC gases. The RPS 404 receives the RPC gases and excites the RPC gases to provide plasma that is fed a processing chamber 405. The purge gas splitter 400 supplies purge gas to showerheads 406, 407,

408, 409 of the processing chamber 405. The showerheads 406, 407, 408, 409 are disposed above respective pedestals (or ESCs) 410, 412, 414, 416. The pedestals hold respective substrates on which layers are formed.

The precursor splitter 394 receives the precursors from the valves 328, 368 and may receive silicon gas from a valve 418. The valve 418 receives silicon gas from the second fluid delivery system 390 via the silicon gas source line 396. The precursor splitter 394 supplies the received precursor gas and silicon gas to the LCV containers 350, 352, 354, 356, which supply the precursor gas and silicon gas to valves 420, 422, 424, 425. Although the LCV containers 350, 352, 354, 356 are shown as being connected in series with respective branches of the splitter 394 and corresponding conduits 426, 427, 428, 429, the LCV containers 350, 352, 354, 356 may 'T'-off the conduits 426, 427, 428, 429.

The precursor divert manifold 398 is used to divert excess precursor from entering the processing chamber 405. The precursor divert manifold 398 receives precursor gas from valves 428, 430, 432, 434, which receive precursor gas from the LCV containers 350, 352, 354, 356. The conversion gas splitter 402 supplies conversion gas to chambers 440, 442, 444, 446 disposed above the showerheads 406, 407, 408, 409. The chambers 440, 442, 444, 446 and corresponding components and devices may be configured similarly as and/or operate similarly as the plasma source 102 of FIG. 1.

Although not shown in FIG. 3, the ampoules 321, 361, valves 324, 364, LCV containers 350, 352, 354, 356, valves 420, 422, 424, 425 and conduits connected between the ampoules 321, 361 and the processing chamber 405 may be heated, as similarly described for other ampoules, valves, LCV containers and conduits of FIGS. 1-2. The ampoules 321, 361, valves 324, 364, LCV containers 350, 352, 354, 356, valves 420, 422, 424, 425 and conduits connected between the ampoules 321, 361 may be heated to aid in vaporizing liquid precursor and/or in maintaining precursor in a vapor state.

By including a LCV container for each processing station, the amount of precursor dilution is reduced for each of the processing stations. As an example, if the LCV containers are not used and precursor vapor, carrier gas, and other gas (e.g., purge gas) are provided to the processing chamber 405, the concentration by volume of precursor vapor may be 7%. In contrast, by using the LCV containers 350, 352, 354, 356, the concentration of precursor vapor by volume may be 19% or higher. A high concentration level of precursor is able to be provided in the processing chamber 405 in a shorter period of time with precharging than without precharging. For example, a high concentration may be provided 3-7 times faster due to precharging. By supplying precursor vapor at a higher pressure and at a higher concentration, the precursor is able to be provided to areas above the substrates in a shorter period of time for reaction with the top surfaces of the substrates in a more efficient manner. The pressure of precursor gas and time associated with charging and/or discharging may be measured in Torr seconds.

Although a single LCV container is shown in FIG. 3 for each processing station, multiple LCV containers may be provided for each processing stations and used to create charges of each precursor. In one embodiment, the two precursor gases are supplied to a shared LCV container of a processing station concurrently and then the output of the LCV is provided to the processing chamber.

In another embodiment, a single LCV container is shared for two precursor gases and first dose, first purge, second dose, and second purge operations are performed in a sequential manner. The first dose operation includes a first precursor vapor and the second dose operation includes a second precursor vapor. During the first dose operation, the LCV container is discharging the first precursor and is not being precharged with the second precursor vapor. Similarly, during the second dose operation, the LCV container is discharging the second precursor and is not being precharged with the first precursor vapor. The second precursor may be provided and supplied to a processing chamber subsequent to the first precursor being supplied to the processing chamber. The second precursor vapor is supplied to react with the first precursor and/or surface of a substrate in the processing chamber. This may be done to prevent the second precursor from reacting with the first precursor prior to both the first precursor and the second precursor being supplied to the processing chamber. The LCV container may however be precharged with the first precursor gas during additional conversion and purge operations. The operations may be repeated for respective cycles of an ALD process.

In yet another embodiment, two distinct LCV containers are provided for two precursor gases and first dose, first purge, second dose, and second purge operations are performed in a sequential manner. The first dose operation includes the first precursor vapor and the second dose operation includes the second precursor vapor. The two separate dose operations may be performed to prevent premixing of the first precursor and the second precursor prior to being supplied to a processing chamber. While one of the LCV containers is discharging, the other LCV container may be precharging. The operations may be repeated for respective cycles of an ALD process.

In yet another embodiment, first dose, first purge, first conversion and second purge operations are performed during each of a first set of cycles and then second dose, third purge, second conversion and forth purge operations are performed during each of a second set of cycles. The first dose and the second dose operations include different precursor vapors. The first set of cycles may be referred to as nucleation cycles and be performed to aid adhesion prior to performing the second set of cycles. The second set of cycles may include more cycles than the first set of cycles.

In another embodiment, two distinct LCV containers are provided for two precursor gases, where dose and purge operations are performed in a sequential manner. The dose operation includes discharging both LCV containers concurrently. The precursors may mix in the processing chamber, not upstream from the processing chamber. The operations may be repeated for respective cycles of an ALD process.

In another embodiment, a dose operation, a first purge operation, a first conversion gas operation, a first purge gas operation, a second conversion gas operation and a third purge gas operation are performed. These operations may be performed sequentially, in the order stated, and repeated for additional ALD cycles.

The above-described embodiments are applicable to the examples of FIGS. 1-4 and 6.

Figure 4:
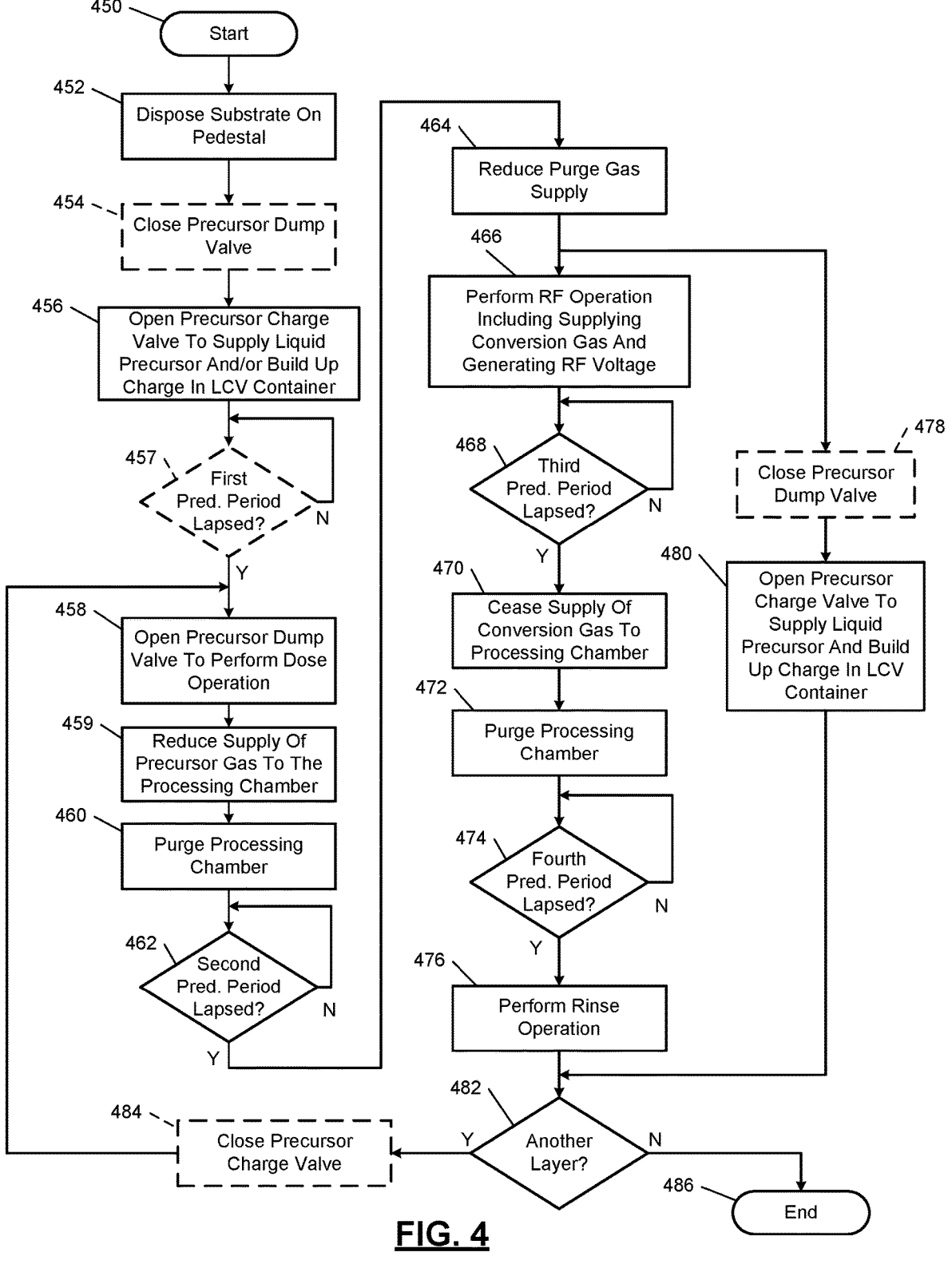
FIG. 4 illustrates an example ALD method including precursor line charging and dispensing in accordance with the present disclosure.

FIG. 4 shows an example ALD method, which may be implemented systems of FIGS. 1-3. The operations of the ALD method may be iteratively performed. Although the following operations are described primarily with respect to a single processing station, the operations may be performed for multiple processing stations. The operations may be performed concurrently for multiple processing stations, such as the processing stations 302, 304, 306, 308 of FIG. 3. The operations may be performed by the system controller 160 of FIG. 1. The method may begin at 450. At 452, a substrate is disposed on a pedestal (or ESC).

The following operations 454, 456, 457, 458, 460, 462, 464 may be performed for a single precursor and a single line charge volume container of a single processing station. Alternatively, the following operations 454, 456, 457, 458, 460, 462, 464 may be performed concurrently for each of multiple processing stations.

The following operations 454, 456, 457, 458, 460, 462, 464 may also be performed for each of two or more precursors. When performing operations 454, 456, 457, 458, 460, 462, 464 for each of two or more precursors, the corresponding sets of the operations 454, 456, 457, 458, 460, 462, 464 performed for each of the precursors may be performed concurrently, separately, sequentially (or serially), or in parallel. For example, operations 454, 456, 457, 458, 460, 462, 464 may be performed for each of two precursors via the precursor circuits 316, 318 of FIG. 3.

In another embodiment, the operations 454, 456, 457, 458, 460, 462, 464 are performed concurrently and/or in parallel for the first fluid dispensing system 202 and the third fluid dispensing system 250 of FIG. 2. The precursor vapors may be discharged concurrently or sequentially.

In an embodiment, the operations 454, 456, 457, 458, 460, 462, 464 are first performed for a first precursor and then performed again for the second precursor using the same line charge volume container. This may occur prior to operation 466.

In another embodiment, operations 454, 456, 457 are performed for both of the precursors to precharge a same line charge volume container with two precursor vapors concurrently. Operations 458, 460, 462, 464 are then performed for both of the precursors, where the line charge volume container dispenses both of the precursor vapors concurrently.

In yet another embodiment, operations 454, 456, 457 are performed concurrently to precharge different line charge volume containers respectively with the precursor vapors. Operations 458, 460, 462, 464 are then performed for each precursor vapor either (i) concurrently to dispense the precursor vapors concurrently into the processing chamber, or (ii) sequentially to first dispense the first precursor vapor, purge the processing chamber and then dispense the second precursor vapor.

At 454, a precursor dump valve (e.g., one of the valves 194, 216, 420, 422, 424, 425 of FIGS. 1-3) is closed. At 456, a precursor charge valve (e.g., one of the valves 134, 207, 340, 380 of FIGS. 1-3) is opened to supply liquid precursor and/or to begin precharging and building up a bulk charge of precursor in a LCV container (e.g., one of the LCV containers 192, 212, 350, 352, 354, 356 of FIGS. 1-3). At 457, the system controller 160 may determine whether a first predetermined period has lapsed. If yes, operation 458 may be performed. In one embodiment, operations 454 and 457 are not performed.

The following operations 458, 459, 460, 462 may be performed for a first precursor. Operations 458, 459, 460, 462 may be repeated for one or more additional precursors. At 458, the system controller 160 opens precursor dump valve to perform a dump operation including supply precursor gas to the corresponding processing chamber to expose a surface of a substrate to the precursor gas. In one embodiment, the precursor charge valve is maintained in an open state during operation 458. In another embodiment, the precursor charge valve is closed during operation 458.

At 459, the precursor charge valve and/or the precursor dump valve may be closed to reduce and/or prevent flow of precursor to the processing chamber. If purge gas is supplied via the precursor charge valve and/or corresponding valve assembly, then the precursor charge valve may be closed to purge the LCV container and/or corresponding conduits. This may be done, for example, prior to charging the LCV container with a second precursor. If purge gas is supplied via the precursor dump valve and/or corresponding valve assembly, the precursor dump valve may be closed.

At 460, the processing chamber is evacuated including supplying purge gas to the processing chamber. At 462, the system controller 160 may determine whether a second predetermined period has lapsed. If yes, operation 464 may be performed.

At 464, the system controller 160 reduces purge gas supply to the processing chamber. This may include ceasing supply of purge gas or reducing flow of purge gas to a "trickle" level of purge gas, which is associated with a trickle mode. Precursor charging may be build up while maintaining trickle purge of the showerhead and the source of purge gas. The LCV charge mode may be ON when not performing a dose operation with the corresponding LCV container. As an alternative, the LCV charge mode may be started and/or stopped using either time based control (charging for set period of time) and/or pressure based control (charging until set pressure reached).

The following operations 466, 470, 472, and 474 may be performed for each of one or more conversion gases. When performed for multiple conversion gases, each set of the operations 466, 470, 472, and 474 may be performed sequentially prior to performing operation 476.

At 466, the system controller 160 performs RF operation including supplying conversion gas and generating RF voltage, as described above, to provide a resultant monolayer (e.g., a silicon nitride $Si_3N_4$ layer) on the substrate. The conversion gas reacts with the surface of the substrate to form the resultant monolayer. At 468, the system controller 160 may determine whether a third predetermined period has lapsed. If yes, operation 470 may be performed. At 470, the system controller 160 ceases supply of conversion to the processing chamber.

At 472, the processing chamber is evacuated including supplying purge gas to the processing chamber. At 474, the system controller 160 may determine whether a fourth predetermined period has lapsed. If yes, operation 476 may be performed. At 476, the system controller 160 performs a rinse operation.

The following operations 478, 480 may be performed in parallel with operations 466, 468, 470, 472, 474, and 476. Operations 478, 480 may be performed for each of one or more precursors. In an embodiment, operations 478, 480 are performed concurrently for each of multiple precursors. Operations 478, 480 may also be performed to charge a LCV container with one precursor while discharging of another precursor is performed from another LCV container.

At 478, the system controller 160 closes the precursor dump valve if not already closed. At 480, the system controller 160 opens the precursor charge valve to supply liquid precursor and begin precharging and building up a bulk charge of precursor in a LCV container (e.g., one of the LCV containers 192, 212, 350, 352, 354, 356 of FIGS. 1-3). Operations 478 and 480 may be performed for one or more precursors and by one or more precursor circuits.

At 482, the system controller 160 may determine whether another monolayer is to be formed on the substrate. If yes, operation 484 may be performed, otherwise operation the method may end at 486. At 484, the system controller 160 may optionally close the precursor charge valve. In one embodiment, operation 484 is not performed and operation 458 is performed.

Subsequent to operations 482 and/or 484, operations 458, 460, 462 and 464 may be performed for one or more precursors as described above. In one embedment, operations 458, 460, 462, 464 are performed for two precursors concurrently using a same line charge volume container. In another embodiment, operations 458, 460, 462, 464 are performed sequentially for two precursors using the same line charge volume container. In another embodiment, operations 458, 460, 462, 464 are performed in parallel for two precursors using two different line charge volume containers.

The above-described operations are meant to be illustrative examples. The operations may be performed sequentially, synchronously, simultaneously, continuously, during overlapping time periods or in a different order depending upon the application. Also, any of the operations may not be performed or skipped depending on the implementation and/or sequence of events.

Figure 5:
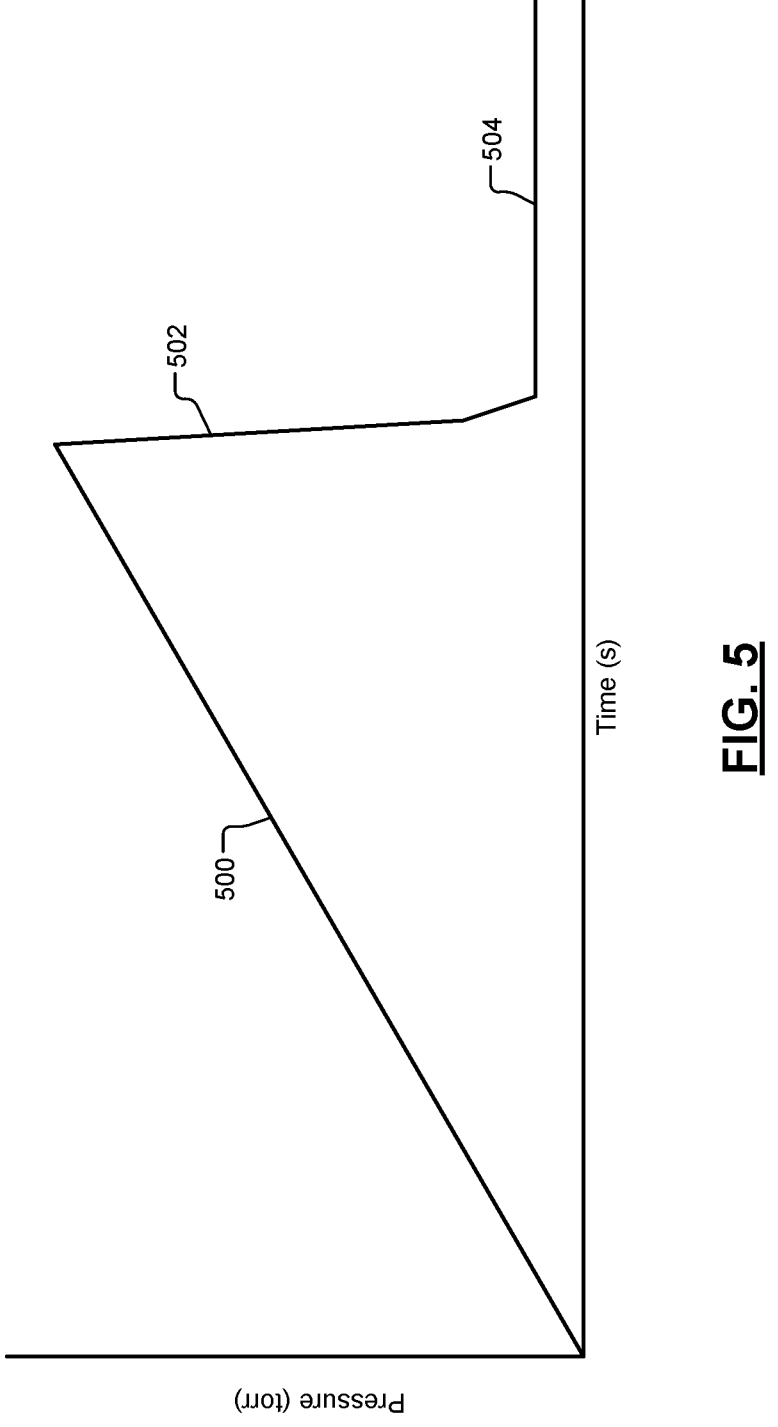
FIG. 5 is an example precursor line pressure versus time plot in accordance with the present disclosure.

FIG. 5 shows an example precursor line pressure versus time plot. This plot shows an example of the charging of precursor in a LCV container, as described above, followed by the dumping of the precursor into a processing chamber. The plot includes a ramp up portion 500, a dump portion 502 and a resultant equilibrium pressure portion 504 within the corresponding precursor conduit (e.g., one of the conduits 197, 219, 426, 427, 428, 429 of FIGS. 1-3). As an example, the charge time may be 4 seconds in length, and the dose time may be 1 second in length.

Figure 6:
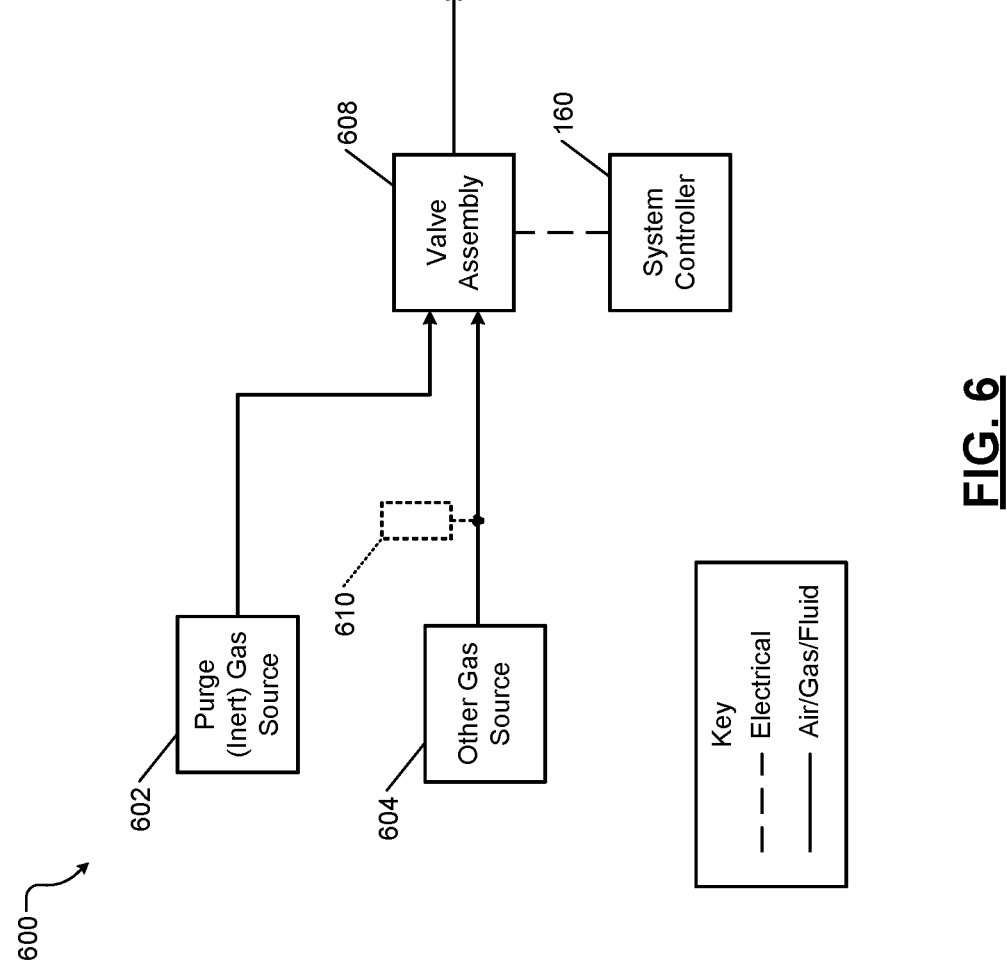
FIG. 6 is a functional block diagram illustrating an example of a back streaming preventative system in accordance with the present disclosure.

FIG. 6 shows a back streaming preventative system 600 that includes a purge (or inert) gas source 602, another gas source 604, a valve assembly 608 and the system controller 160. The gas source 604 may refer to one of the ampoules 190, 208, 260, 321, 361, the circuit 158, the first fluid delivery system 206, the second fluid delivery system 230, the second fluid delivery system 390, or other gas source of FIGS. 1-3. The valve assembly 608 may include one or more valves, multiple inputs and an output. The system controller 160 controls operations of the one or more valves. The valve assembly 608 may replace any and/or all of the valves 154, 194, 207, 216, 252, 256, 322, 328, 362, 368, 420, 422, 424, 425 and/or valves located in the circuit 158, the fluid delivery system 130, the first fluid delivery system 206, the second fluid delivery system 230, the first fluid delivery system 314, and/or the second fluid delivery system 390 of FIGS. 1-3. Each of the valve assemblies may be controlled by the controller 160. In one embodiment, the purge gas 602 is continuously flowing at least at a trickle flow rate through the valve assembly 608. The continuous flow of purge gas may occur while gas from the other gas source 604 is flowing through the valve assembly 608. If the other gas source is a precursor vapor source, a LCV container 610 may be included between the other gas source 604 and the valve assembly and used as described above with respect to other LCV containers.

The continuous flow of purge gas prevents back streaming of other gases and condensation in components. The controller 160 may cease flow of the gas from the other gas source 604 to the output of the valve assembly 608 during a purge operation, in which case purge gas from the purge gas source 602 is flowing at a high pressure through the valve assembly 608. The controller 160 reduces the flow of the purge gas via the valve assembly 608 when the other gas is flowing at a high pressure from the other gas source 604 to the output of the valve assembly 608.

The above-described examples provide increased precursor concentration levels for ALD using LCV containers. The LCV containers are used as reservoirs to collect precursor mixtures ranging from a 0-100% concentration level by volume for precursors received from a fluid delivery system. A 100% or less concentration level may be generated using a vapor draw system and a 50% concentration level or less may be generated by a FOV system. A vapor draw system may refer to a system that does not use carrier gas to entrain precursor vapor to flow into a showerhead. The pressure of the precursor vapor is high enough to draw the vapor towards a lower pressure area existing in the showerhead and/or in the corresponding processing chamber. The above-described systems may operate as vapor draw systems. As another example, a FOV system may provide a 46% concentration level prior to being received at a LCV container. The pressure buildup in the LCV container may be maintained under pressure of supplied precursor to the LCV container. The precursor dispensing system minimizes precursor dilution by providing a bulk discharge of precursor within a reduced amount of time.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A precursor dispensing system comprising:
a first source configured to supply a first liquid precursor;
a first ampoule configured to receive the first liquid precursor from the first source;
a first valve configured to adjust flow of the first liquid precursor from the first source to the first ampoule;
a second valve configured to adjust flow of a first precursor vapor from the first ampoule to a showerhead of a substrate processing chamber;
a first line charge volume container connected to a first conduit and configured to store a charge of the first precursor vapor, wherein the first conduit extends from the first ampoule to the second valve, wherein the first line charge volume container has at least one of
i) only a single port through which the first precursor vapor flows,
ii) a larger inner volume than the first conduit,
iii) a larger inner diameter than the first conduit, and
iv) a larger inner cross-sectional area than the first conduit, where the inner cross-sectional area of the first line charge volume container is of the inner volume of the first line charge volume container and is perpendicular to a direction of flow of the first precursor vapor between the first line charge volume container and the first conduit; and
a controller configured to
open the first valve and close the second valve to precharge the first line charge volume container, and
during a first dose operation, open the second valve to dispense a bulk amount of the first precursor vapor from the first line charge volume container and into the substrate processing chamber.

2. The precursor dispensing system of claim 1, wherein the controller is configured to precharge the first line charge volume container while performing non-dose operations.

3. The precursor dispensing system of claim 1, wherein the controller is configured to precharge the first line charge volume container while performing a dose operation including discharging a second line charge volume container.

4. The precursor dispensing system of claim 1, further comprising:
a second source configured to supply a second liquid precursor;
a second ampoule configured to receive the second liquid precursor from the second source; and
a third valve configured to adjust flow of the second liquid precursor from the second source to the second ampoule, wherein the controller is configured to
open the third valve and close the second valve to precharge the first line charge volume container with a second precursor vapor from the second ampoule concurrently with the first precursor vapor, and
during the first dose operation, open the second valve to dispense a bulk amount of the first precursor vapor and the second precursor vapor from the first line charge volume container and into the substrate processing chamber.

5. The precursor dispensing system of claim 1, further comprising:
a second source configured to supply a second liquid precursor;
a second ampoule configured to receive the second liquid precursor from the second source;
a third valve configured to adjust flow of the second liquid precursor from the second source to the second ampoule; and
a fourth valve configured to adjust flow of a second precursor vapor from the second ampoule to the showerhead,
wherein the controller is configured to
open the third valve and close the fourth valve to precharge the first line charge volume container with the second precursor vapor, and
during a second dose operation subsequent to the first dose operation, open the fourth valve to dispense a bulk amount of the second precursor vapor from the first line charge volume container and into the substrate processing chamber.

6. The precursor dispensing system of claim 1, further comprising:
a second source configured to supply a second liquid precursor;
a second ampoule configured to receive the second liquid precursor from the second source;
a third valve configured to adjust flow of the second liquid precursor from the second source to the second ampoule;
a fourth valve configured to adjust flow of a second precursor vapor from the second ampoule to the showerhead; and
a second line charge volume container connected to a second conduit, wherein the second conduit extends from the second ampoule to the fourth valve and stores a charge of the second precursor vapor,
wherein the controller is configured to
open the third valve and close the fourth valve to precharge the second line charge volume container with the second precursor vapor, and
during a second dose operation subsequent to the first dose operation, open the fourth valve to dispense a bulk amount of the second precursor vapor from the second line charge volume container and into the substrate processing chamber.

7. The precursor dispensing system of claim 1, further comprising:
a second source configured to supply a second liquid precursor;
a second ampoule configured to receive the second liquid precursor from the second source;
a third valve configured to adjust flow of the second liquid precursor from the second source to the second ampoule;
a fourth valve configured to adjust flow of a second precursor vapor from the second ampoule to the showerhead; and a second line charge volume container connected to a second conduit, wherein the second conduit extends from the second ampoule to the fourth valve and stores a charge of the second precursor vapor, wherein the controller is configured to open the third valve and close the fourth valve to precharge the second line charge volume container with the second precursor vapor, and during the first dose operation, open the fourth valve to dispense a bulk amount of the second precursor vapor from the second line charge volume container and into the substrate processing chamber.

8. The precursor dispensing system of claim 1, further comprising:

a second source configured to supply a carrier gas; and a third valve configured to adjust flow of the carrier gas from the second source to the first ampoule, wherein the controller is configured to, during the first dose operation, flow the carrier gas across the first liquid precursor in the first ampoule to entrain the first precursor vapor to flow into the showerhead.

9. The precursor dispensing system of claim 1, wherein the controller is configured to, during the first dose operation, refrain from flowing a carrier gas across the first liquid precursor.

10. The precursor dispensing system of claim 1, wherein the controller is configured to maintain the first valve at least partially open during the first dose operation.

11. The precursor dispensing system of claim 1, wherein the controller is configured to close the first valve prior to or during the first dose operation.

12. The precursor dispensing system of claim 1, further comprising a third valve configured to divert a portion of the first precursor vapor from being received by the showerhead, wherein the controller is configured to control the third valve to divert excess of the first precursor vapor away from the showerhead.

13. The precursor dispensing system of claim 1, further comprising:

a second source configured to supply a purge gas; and a third source configured to supply a conversion gas, wherein the first valve includes a first input, a second input and an output;

the first input receives an output from the second source;

the second input receives the output of the first ampoule or the third source; and the controller controls the first valve to flow the purge gas through the first valve and to the output of the first valve to prevent back streaming of non-purge gas to the first source or the third source.

14. The precursor dispensing system of claim 1, further comprising:

a valve assembly comprising the first valve, a first input, a second input and an output;

a second source configured to supply a purge gas to the first input; and a third source configured to supply a conversion gas, wherein the second input receives the output of the first ampoule or the third source; and the controller controls the valve assembly to flow the purge gas through the valve assembly and to the output of the valve assembly to prevent back streaming of non-purge gas to the first source or the third source.

15. An atomic layer deposition system comprising:

the precursor dispensing system of claim 1;

a third valve configured to adjust flow of a conversion gas to the substrate processing chamber;

a second source configured to supply the conversion gas; and a generator configured to generate a radio frequency signal, wherein the controller is configured to, subsequent the first dose operation, decrease flow of the first precursor vapor to the showerhead, purge the substrate processing chamber, supply the conversion gas to the substrate processing chamber, and control operation of the generator to supply the radio frequency signal to the showerhead.

16. The atomic layer deposition system of claim 15, wherein the controller is configured to precharge the first line charge volume container while supplying the conversion gas to the substrate processing chamber.

17. The precursor dispensing system of claim 1, wherein the first line charge volume container is configured to store the first precursor vapor and is directly connected to the first conduit.

18. The precursor dispensing system of claim 17, wherein the first line charge volume container is open to the first conduit independent of a state of the second valve.

19. The precursor dispensing system of claim 17, wherein the first line charge volume container provides increased volume over a volume of the first conduit to provide an increased amount of the first precursor vapor to the substrate processing chamber when the second valve is opened.

20. The precursor dispensing system of claim 1, wherein the controller is configured to precharge the first line charge volume container to a predetermined pressure at least one of i) based on an output of a pressure sensor, which detects pressure within the first conduit, and ii) by precharging the first line charge volume container for a predetermined time period such that the first line charge volume container is at the predetermined pressure.

21. The precursor dispensing system of claim 1, wherein the controller is configured to charge the first line charge volume container until a target pressure is reached prior to opening the second valve.

22. The precursor dispensing system, of claim 21, further comprising a sensor configured to detect pressure within the first conduit, wherein the controller is configured to precharge the first line charge volume container to the target pressure based on an output of the sensor.

23. The precursor dispensing system of claim 1, wherein the first line charge volume container does not include a conduit and further does not include a valve.

24. The precursor dispensing system of claim 1, wherein the first line charge volume container has only the single port through which the first precursor vapor flows.

25. The precursor dispensing system of claim 1, wherein the inner volume of the first line charge volume container is larger than the inner volume of the first conduit.

26. The precursor dispensing system of claim 1, wherein the inner diameter of the first line charge volume container is larger than the inner diameter of the first conduit.

27. The precursor dispensing system of claim 1, wherein the inner cross-sectional area of the inner volume of the first line charge volume container is larger than the inner cross-sectional area of the inner volume of the first conduit.

28. The precursor dispensing system of claim 1, wherein the first line charge volume container is connected to the first conduit via a second conduit extending from the first line charge volume container to the first conduit.

29. The precursor dispensing system of claim 28, wherein the controller is configured, during the first dose operation, to open the second valve to dispense a bulk amount of the first precursor vapor from the first line charge volume container into the second conduit followed by the first conduit and then the substrate processing chamber.

\* \* \* \* \*